United States Patent
Tsuji

(10) Patent No.: US 10,998,697 B2
(45) Date of Patent: May 4, 2021

(54) METHOD OF MANUFACTURING SURFACE EMITTING LASER

(71) Applicant: SUMITOMO ELECTRIC INDUSTRIES, LTD., Osaka (JP)

(72) Inventor: Yukihiro Tsuji, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/577,288

(22) Filed: Sep. 20, 2019

(65) Prior Publication Data

US 2020/0136351 A1   Apr. 30, 2020

(30) Foreign Application Priority Data

Oct. 25, 2018  (JP) .............................. JP2018-200658

(51) Int. Cl.
  *H01S 5/042* (2006.01)
  *H01S 5/183* (2006.01)
  *H01S 5/343* (2006.01)
  *H01S 5/02* (2006.01)

(52) U.S. Cl.
  CPC ........ *H01S 5/18361* (2013.01); *H01S 5/0206* (2013.01); *H01S 5/04252* (2019.08); *H01S 5/18347* (2013.01); *H01S 5/34313* (2013.01)

(58) Field of Classification Search
  None
  See application file for complete search history.

(56) References Cited

U.S. PATENT DOCUMENTS

| | | | | |
|---|---|---|---|---|
| 2007/0241354 A1* | 10/2007 | Tanaka | ................ | H01S 5/04257 257/98 |
| 2010/0029027 A1* | 2/2010 | Ikuta | .................. | H01S 5/18391 438/29 |
| 2012/0178238 A1* | 7/2012 | Sekiguchi | ......... | H01L 29/78603 438/458 |

FOREIGN PATENT DOCUMENTS

WO    2015-033649    3/2015

* cited by examiner

*Primary Examiner* — Jay C Chang
(74) *Attorney, Agent, or Firm* — Smith, Gambrell & Russell, LLP.

(57) ABSTRACT

A method of manufacturing a surface emitting laser includes: preparing a substrate on which a lower reflector layer, an active layer and an upper reflector layer are formed in this order from the bottom, each of the lower reflector layer and the upper reflector layer including a semiconductor multilayer film; forming an insulating film on the upper reflector layer; cleaning the substrate using isopropyl alcohol after the forming; patterning a photoresist by applying the photoresist on the insulating film and exposing the photoresist, after the cleaning; and forming a high resistance region by implanting ions into portions of the lower reflector layer, the active layer and the upper reflector layer exposed from the photoresist, after the patterning; wherein the cleaning includes cleaning the substrate with a liquid of the isopropyl alcohol and drying the substrate in a vapor of the isopropyl alcohol.

6 Claims, 9 Drawing Sheets

METHOD OF MANUFACTURING SURFACE EMITTING LASER

CROSS-REFERENCE TO RELATED APPLICATION

This application is based upon and claims the benefit of priority of the prior Japanese Patent Application No. 2018-200658, filed on Oct. 25, 2018, the entire contents of which are incorporated herein by reference.

BACKGROUND

(i) Technical Field

The present invention relates to a method of manufacturing a surface emitting laser.

(ii) Related Art

A patent document (International Publication Pamphlet No. 2015/033649) discloses a vertical cavity surface emitting laser (VCSEL). In the VCSEL, a high resistance region may be formed by implanting ions into a semiconductor layer in order to reduce parasitic capacitance.

SUMMARY

In a step of ion implantation, patterning of a photoresist is performed. A region where the ions are not implanted is covered with the photoresist, and a region where the ions are implanted is exposed from the photoresist. However, bubbles are generated between the photoresist and the wafer, and the photoresist may be peeled off. When the ions are implanted into unintended positions from a peeled portion of the photoresist, defective products are generated. Therefore, the present invention aims to provide a method of manufacturing a surface emitting laser that can suppress peeling of the photoresist.

According to an aspect of the present invention, there is provided a method of manufacturing a surface emitting laser including: preparing a substrate on which a lower reflector layer, an active layer and an upper reflector layer are formed in this order from the bottom, each of the lower reflector layer and the upper reflector layer including a semiconductor multilayer film; forming an insulating film on the upper reflector layer; cleaning the substrate using isopropyl alcohol after the forming; patterning a photoresist by applying the photoresist on the insulating film and exposing the photoresist, after the cleaning; and forming a high resistance region by implanting ions into portions of the lower reflector layer, the active layer and the upper reflector layer exposed from the photoresist, after the patterning; wherein the cleaning includes cleaning the substrate with a liquid of the isopropyl alcohol and drying the substrate in a vapor of the isopropyl alcohol.

DETAILED DESCRIPTION

Figure 1A:
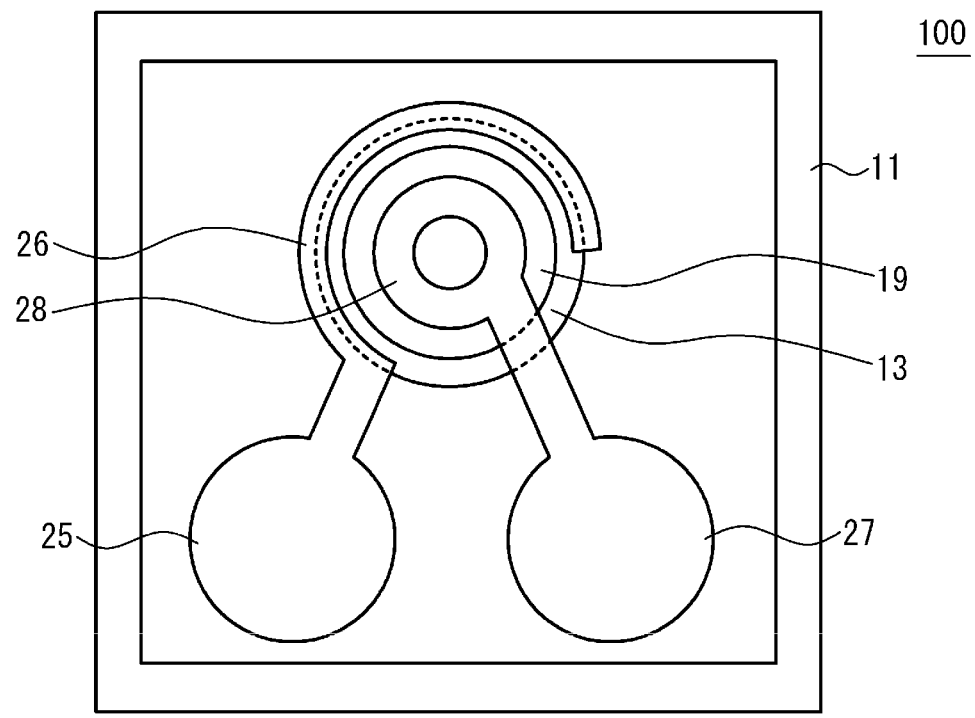
FIG. 1A is a plane view showing an example of a surface emitting laser according to a first embodiment.

Description of Embodiments of the Present Invention

First, the contents of embodiments of the present invention are listed below.

An embodiment of the present invention is (1) a method of manufacturing a surface emitting laser including: preparing a substrate on which a lower reflector layer, an active layer and an upper reflector layer are formed in this order from the bottom, each of the lower reflector layer and the upper reflector layer including a semiconductor multilayer film; forming an insulating film on the upper reflector layer; cleaning the substrate using isopropyl alcohol after the forming; patterning a photoresist by applying the photoresist on the insulating film and exposing the photoresist, after the cleaning; and forming a high resistance region by implanting ions into portions of the lower reflector layer, the active layer and the upper reflector layer exposed from the photoresist, after the patterning; wherein the cleaning includes cleaning the substrate with a liquid of the isopropyl alcohol and drying the substrate in a vapor of the isopropyl alcohol. The cleaning is performed with the isopropyl alcohol, so that the generation of aggregation water can be suppressed. For this reason, it is also possible to suppress the generation of bubbles due to the aggregation water, and to suppress the peeling of the photoresist.

(2) The cleaning the substrate with the liquid of the isopropyl alcohol may include immersing the substrate in the liquid of the isopropyl alcohol, and replacing the isopropyl alcohol adhering to the substrate with another isopropyl alcohol. Thereby, organic substances can be removed, and the aggregation of moisture by the organic substances can be suppressed.

(3) The method may include processing a surface of the insulating film with hexamethyldisilazane (HMDS) after the cleaning and before the patterning. Since the generation of the aggregation water is suppressed, it is possible to suppress the decomposition of HMDS and the generation of the bubbles by the aggregation water.

(4) The forming the insulating film may include forming a resist pattern on the insulating film, etching a part of the insulating film using the resist pattern, and removing the resist pattern by oxygen ashing. An oxide film is formed on the insulating film by the oxygen ashing. Since the cleaning is performed with the isopropyl alcohol, the aggregation of the moisture by the oxide film can be suppressed.

(5) The insulating film may be a silicon nitride film. There is a case where the insulating film is oxidized to form a silicon oxide film. Since the cleaning is performed with the isopropyl alcohol, the aggregation of the moisture by the silicon oxide film can be suppressed.

(6) A depth to which the ions are implanted may be 5 µm or more, and a thickness of the photoresist may be 10 µm or more. When the photoresist having a thickness of 10 µm or more is provided to shield the ions, the moisture under the photoresist is hard to release. The cleaning is performed with the isopropyl alcohol, so that the moisture is hard to remain under the photoresist, and the peeling of the photoresist can be suppressed.

Detailed Description of an Embodiment of the Present Invention

The following is a description of specific examples of a method of manufacturing a surface emitting laser according to an embodiment of the present invention, with reference to the drawings. It should be noted that the present invention is not limited to these examples but is indicated by the claims, and it is intended that all changes within the meanings and the scopes of the claims and the equivalents thereof are included therein.

First Embodiment (Surface Emitting Laser)

Figure 1B:
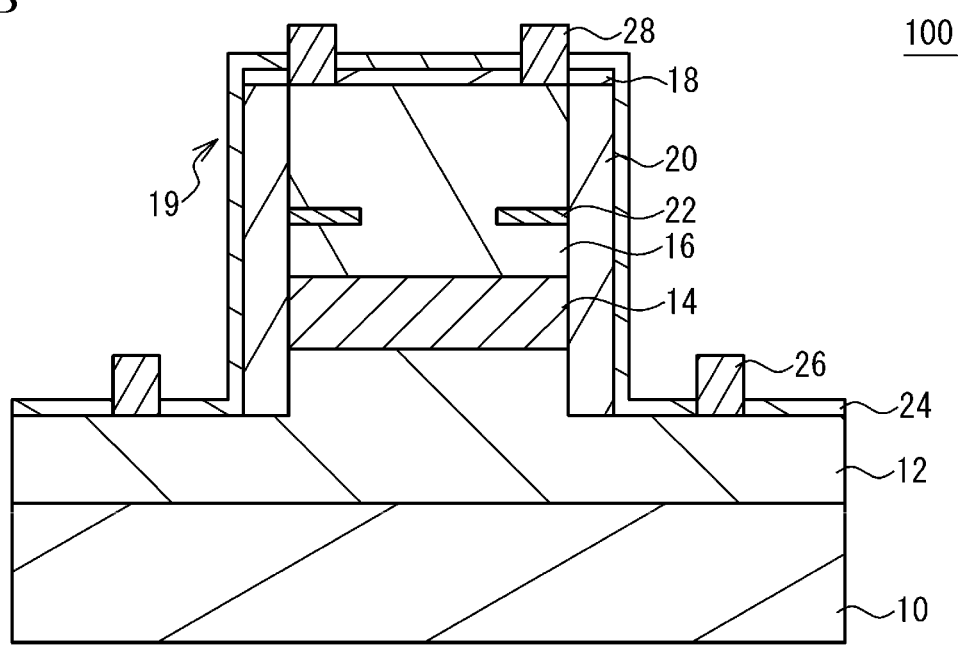
FIG. 1B is a cross-sectional view showing the example of the surface emitting laser.

FIG. 1A is a plane view showing an example of a surface emitting laser 100 according to a first embodiment. FIG. 1B is a cross-sectional view showing the example of the surface emitting laser 100.

As shown in FIG. 1A, a groove 11 for element separation is provided on an outer peripheral portion of the surface emitting laser 100. A mesa 19 and pads 25 and 27 are located in a region surrounded by the groove 11. A groove 13 is provided around the mesa 19. An electrode 28 is provided on the mesa 19, and an electrode 26 is provided in the groove 13. The pad 25 is electrically connected to the electrode 26, and the pad 27 is electrically connected to the electrode 28.

FIG. 1B is an enlarged view in the vicinity of the mesa 19. As shown in FIG. 1B, the surface emitting laser 100 is a vertical cavity surface emitting laser (VCSEL) including a substrate 10, a lower distributed bragg reflector (DBR) layer 12 (hereinafter referred to as "a lower reflector layer 12"), an active layer 14, an upper DBR layer 16 (hereinafter referred to as "an upper reflector layer 16"), insulating films 18 and 24, and electrodes 26 and 28.

The substrate 10 is a semiconductor substrate made of insulating gallium arsenide or n-type gallium arsenide (GaAs), for example. The lower reflector layer 12, the active layer 14, and the upper reflector layer 16 are sequentially stacked on the substrate 10, and these semiconductor layers form the mesa 19.

The lower reflector layer 12 is, for example, a semiconductor multilayer film in which n-type $Al_{0.16}Ga_{0.84}As$ and n-type $Al_{0.9}Ga_{0.1}As$ are alternately stacked every optical film thicknesses $\lambda/4$, and includes a contact layer made of AlGaAs. Here, the "$\lambda$" is a wavelength of light. The lower reflector layer 12 is doped with, for example, silicon (Si). The lower reflector layer 12 also includes a contact layer in contact with the electrode 26.

The active layer 14 is made of, for example, AlGaAs and AlInGaAs, has multiple quantum well (MQW) structure in which quantum well layers and barrier layers are alternately stacked, and has an optical gain. Clad layers (not shown) are interposed between the active layer 14 and the lower reflector layer 12 and between the active layer 14 and the upper reflector layer 16.

The upper reflector layer 16 is, for example, a semiconductor multilayer film in which p-type $Al_{0.16}Ga_{0.84}As$ and p-type $Al_{0.9}Ga_{0.1}As$ are alternately stacked every optical film thicknesses $\lambda/4$, and includes a contact layer made of AlGaAs. The upper reflector layer 16 is doped with, for example, carbon (C). The upper reflector layer 16 also includes a contact layer in contact with the electrode 28. The substrate 10, the lower reflector layer 12, the active layer 14, and the upper reflector layer 16 may be made of a compound semiconductor other than the above.

A part of the upper reflector layer 16 is selectively oxidized, so that a current constriction layer 22 is formed. The current constriction layer 22 is formed on the periphery of the upper reflector layer 16 and is not formed in the center of the upper reflector layer 16. The current constriction layer 22 contains, for example, aluminum oxide ($Al_2O_3$), has an insulating characteristic, and is hard to flow a current compared with a non-oxidized portion. Therefore, the non-oxidized portion located in the center of the upper reflector layer 16 serves as a current path, which enables efficient current injection.

A high resistance region 20 is formed at the periphery of the mesa 19 and outside the current constriction layer 22. The high resistance region 20 is formed on the periphery of the upper reflector layer 16, the active layer 14 and a part of an upper side of the lower reflector layer 12. Then, the high resistance region 20 is formed by ion implantation as described later.

The insulating film 18 is provided on an upper surface of the mesa 19, and the insulating film 24 which covers an upper surface of the lower reflector layer 12, the periphery of the high resistance region 20 and the upper surface of the mesa 19 (i.e., the upper surface of the insulating film 18) is further provided. The insulating film 18 is, for example, a silicon nitride (SiN) film having a thickness of 40 nm. The insulating film 24 contains, for example, one of SiN, silicon oxynitride (SiON) and silicon oxide ($SiO_2$), and has a thickness of, for example, 40 nm. The insulating film 24 serves as a reflective film that reflects the light emitted from the active layer 14. A thickness and a refractive index of the insulating film 24 are determined so as to increase a reflectivity. Openings are provided on parts of the insulating films 18 and 24, and the electrodes 26 and 28 are provided in the openings.

The electrode 26 is an n-type electrode having stacked structure of, for example, gold germanium (AuGe) and nickel (Ni), and is in contact with a surface of the lower reflector layer 12. The electrode 28 is a p-type electrode having stacked structure of, for example, titanium (Ti), platinum (Pt) and Au, and is in contact with a surface of the upper reflector layer 16. The electrodes 26 and 28 may be made of metals achieving ohmic contact with the lower reflector layer 12 and the upper reflector layer 16, respectively.

(Manufacturing Method)

Next, a description will be given of the method of manufacturing the surface emitting laser 100. FIGS. 2A to 8B are cross-sectional views showing an example of the method of manufacturing the surface emitting laser 100.

Figure 2A:
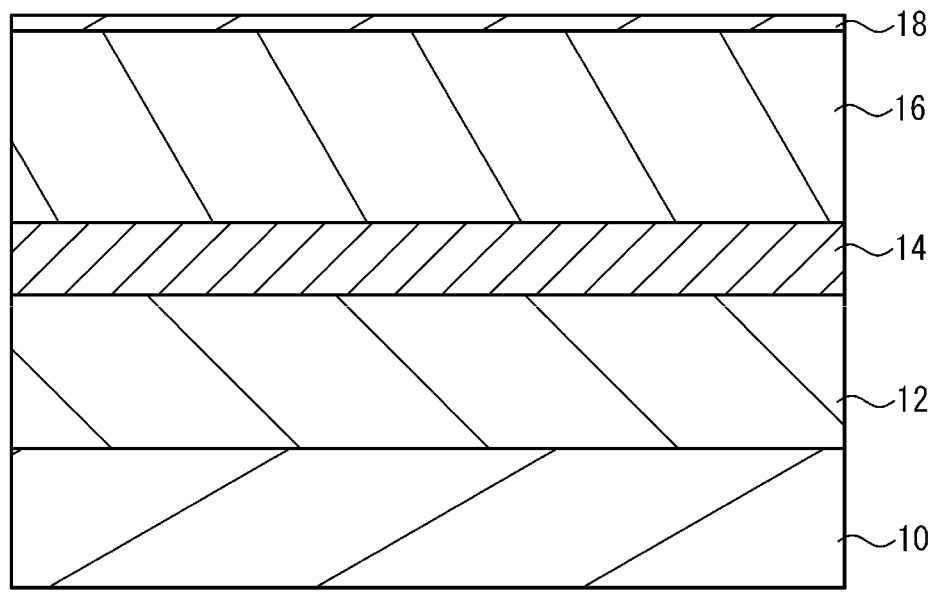
FIGS. 2A and 2B are plane views showing the example of a method of manufacturing the surface emitting laser.

As shown in FIG. 2A, the lower reflector layer 12, the active layer 14 and the upper reflector layer 16 are epitaxially grown in order on the substrate 10 by a metal organic chemical vapor deposition (MOCVD) method or a molecular beam epitaxy (MBE) method, for example. The lower reflector layer 12 includes an $AlxGa1-xAs$ layer ($0.9 \le x \le 1.0$) for forming the current constriction layer 22. For example, the insulating film 18 is formed on the surface of the upper reflector layer 16 by a plasma CVD method or the like.

Figure 2B:
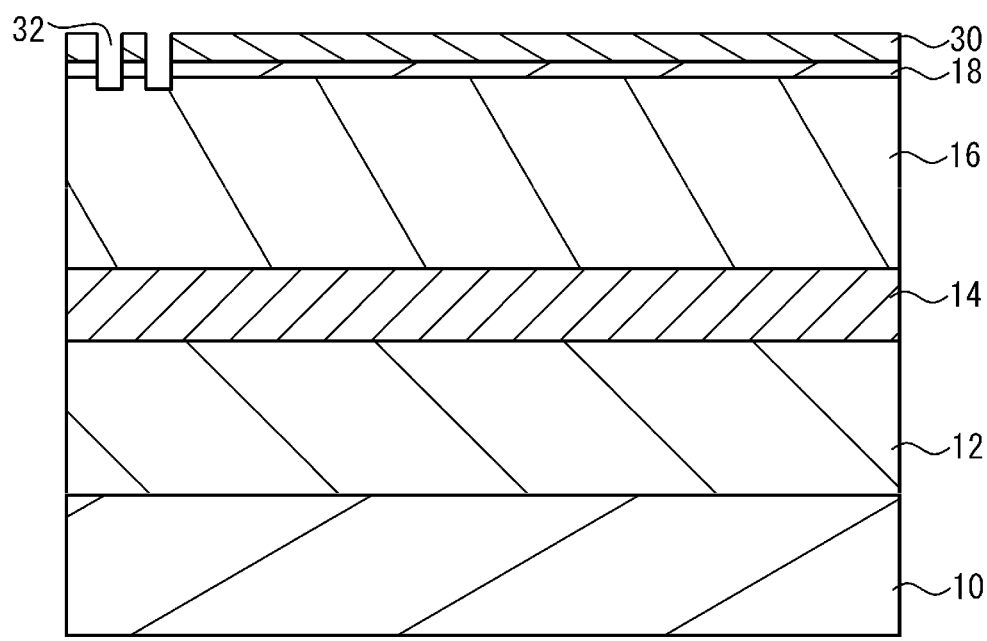

As shown in FIG. 2B, marks 32 are formed. The marks 32 are a reference for alignment of a resist pattern or the like, and is an irregularity portion having a depth of 100 nm to 200 nm which can be image-recognized by an exposure apparatus. A photoresist 30 is applied to the surface of the insulating film 18, a resist pattern is formed by a photolithography method, and etching is performed to form the marks 32. For example, plasma etching is performed on the insulating film 18 using a fluorocarbon-based gas, and plasma etching is performed on the upper reflector layer 16 using a chlorine-based gas.

Figure 3A:
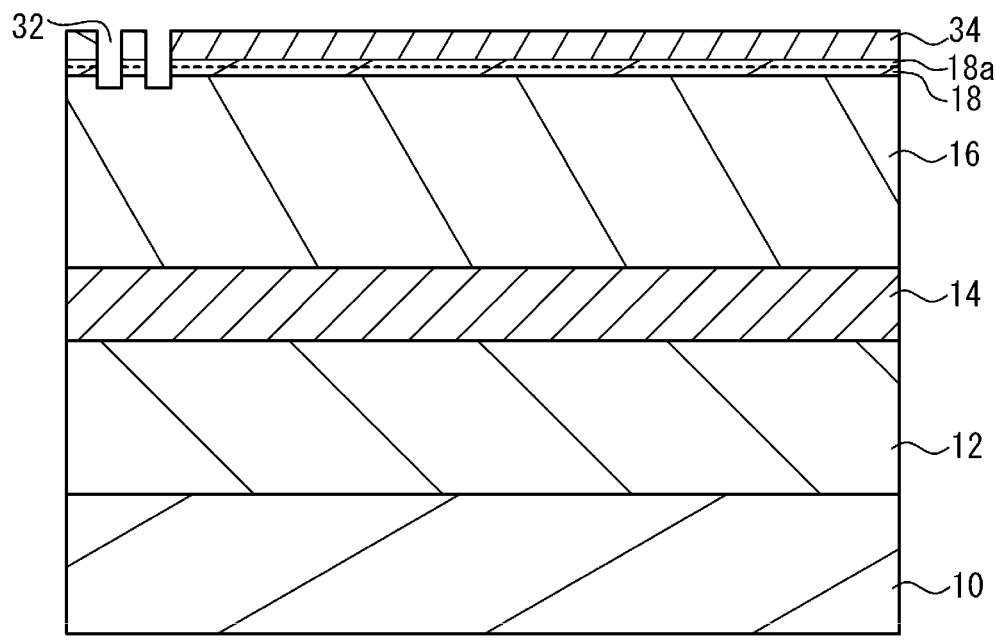
FIGS. 3A and 3B are plane views showing the example of the method of manufacturing the surface emitting laser.

As shown in FIG. 3A, after the formation of the marks 32, the photoresist 30 is removed by asking using an organic solvent, oxygen plasma or the like. At this time, it is considered that the surface of the insulating film 18 is oxidized to form an oxide film 18a containing $SiO_2$. In addition, it is presumed that organic substances such as siloxane 34 are deposited on a wafer surface due to contamination in a clean room where a manufacturing process is performed. The oxide film 18a is omitted in the following drawings.

Figure 3B:
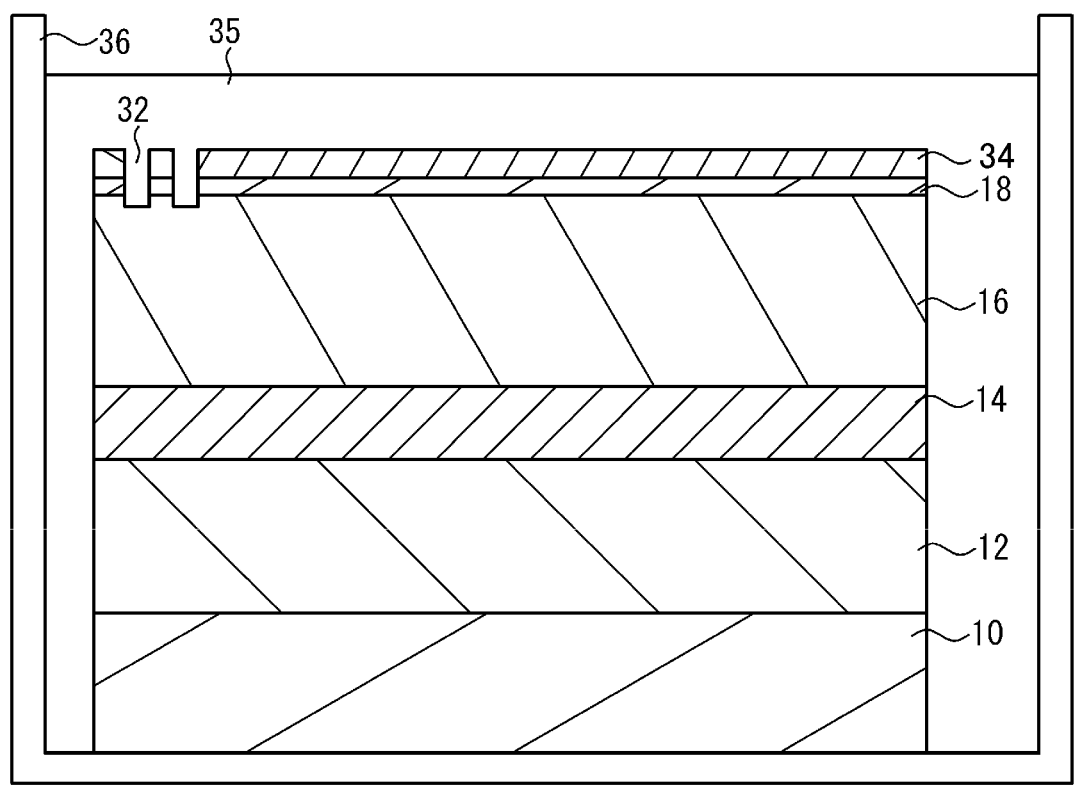
Figure 4A:
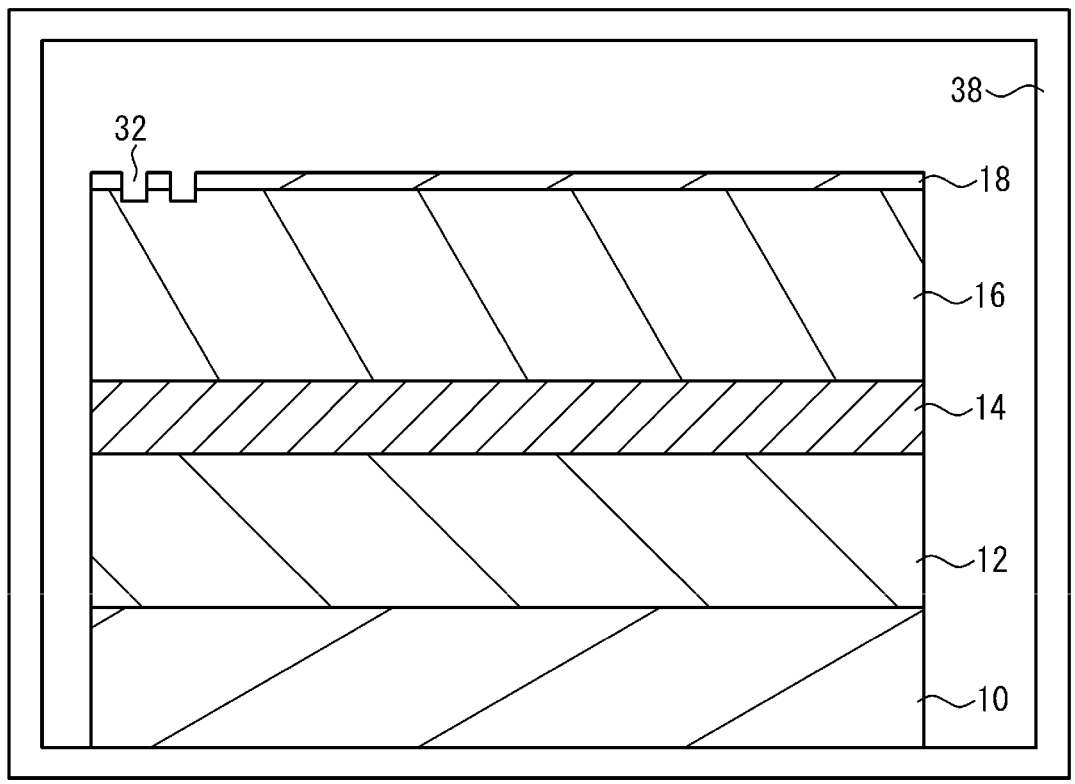
FIGS. 4A and 4B are plane views showing the example of the method of manufacturing the surface emitting laser.

Next, the wafer is cleaned. Specifically, first of all, as shown in FIG. 3B, the wafer is immersed in isopropanol (i.e., isopropyl alcohol, IPA) 35 stored in a cleaning tank 36, and ultrasonic cleaning is performed. The IPA adhering to the wafer taken out of the cleaning tank 36 is replaced with another IPA. Hereinafter, this is referred to as "IPA replacement". The IPA replacement is to clean the IPA adhering to the wafer with a liquid of another IPA without cleaning the wafer with pure water, to thereby replace the IPA with the another IPA. After the IPA replacement, a drying device 38 is filled with IPA vapor having a concentration of 100%, and the wafer is introduced therein, as shown in FIG. 4A. For example, the wafer is dried while a temperature of 200° C. is maintained for 5 minutes in an atmosphere of the IPA vapor.

Figure 4B:
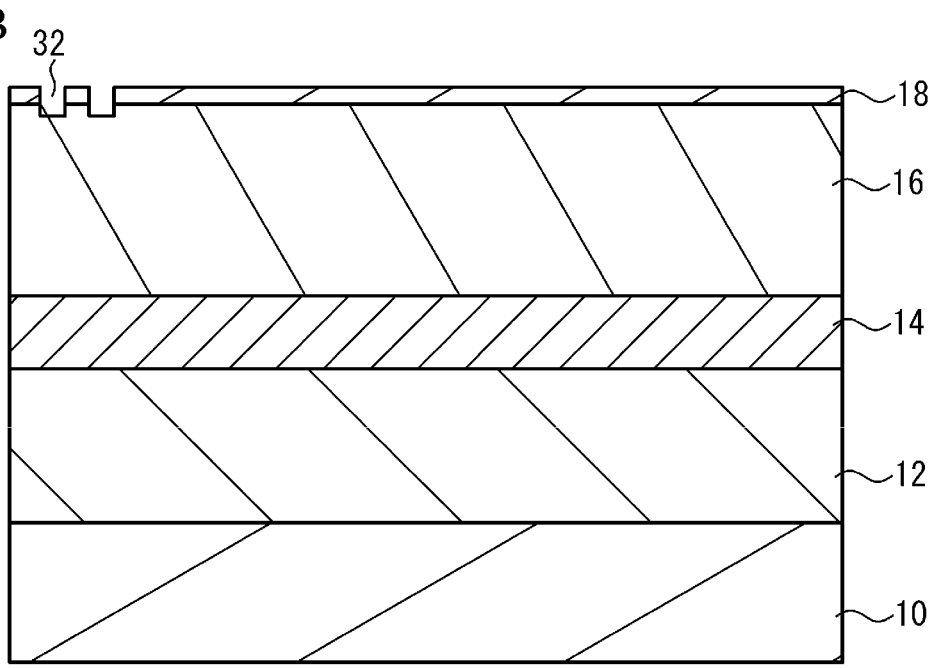

As shown in FIG. 4B, the IPA takes in the organic substances such as the siloxane 34 and flows down to remove the organic substances. Since the IPA is used without using water, condensation of the moisture into the oxide film is suppressed. Further, the drying is performed in the IPA vapor, so that IPA molecules forming, for example, about a single atomic layer remain on a wafer surface, and a hydrophobic surface is formed. For this reason, re-adhesion of the moisture is also suppressed.

Hexamethyldisilazane (HMDS) process is performed on the surface of the wafer taken out of the drying device 38. By the HMDS process, the hydrophilic wafer surface containing a silanol group is terminated with a methyl group and reformed into the hydrophobic surface. Since the IPA cleaning is performed before the HMDS process, the aggregation of the moisture by the oxide film and the siloxane 34 is suppressed. Therefore, hydrolysis of the HMDS by the aggregation water is also less likely to occur, and the generation of gasification components such as ammonia ($NH_3$) from the HMDS is suppressed.

Figure 5A:
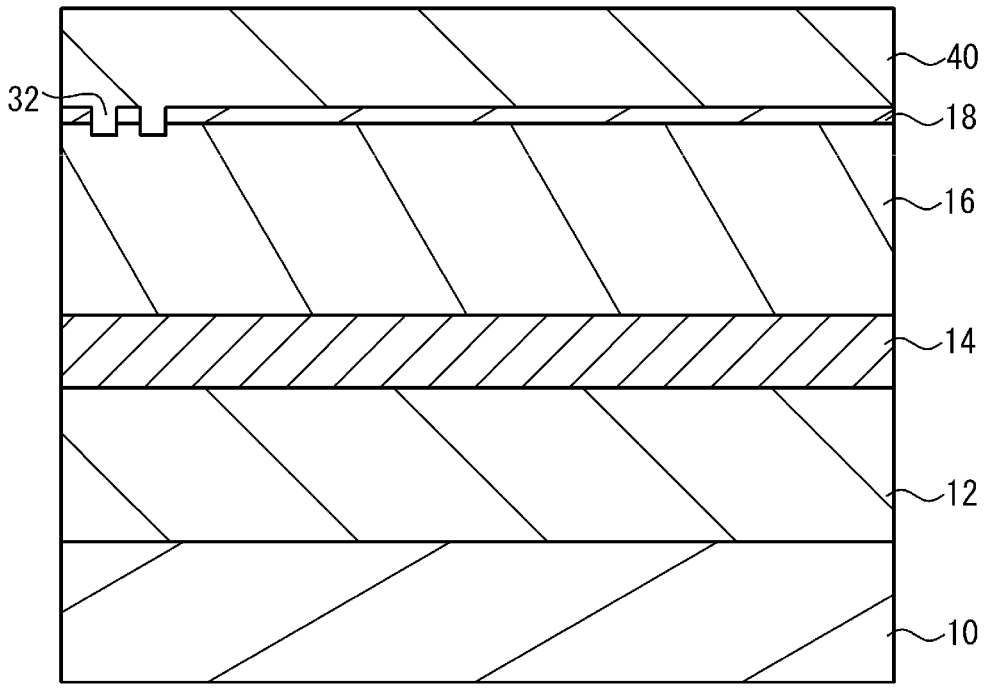
FIGS. 5A and 5B are plane views showing the example of the method of manufacturing the surface emitting laser.
Figure 5B:
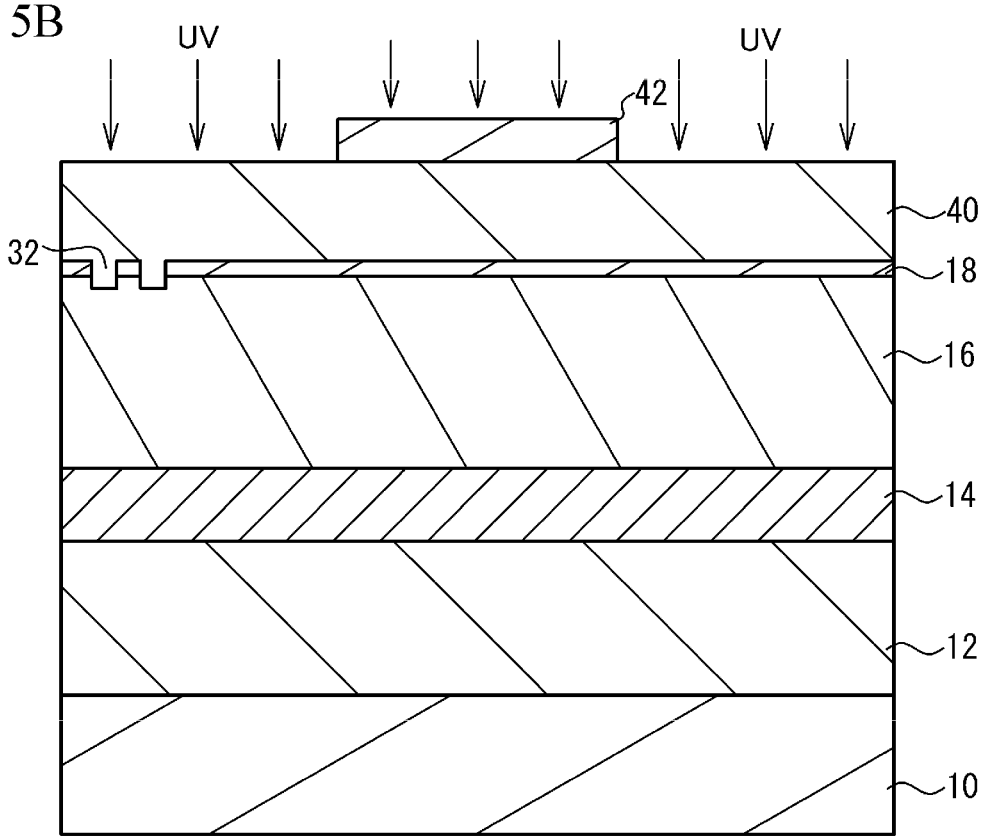
Figure 6A:
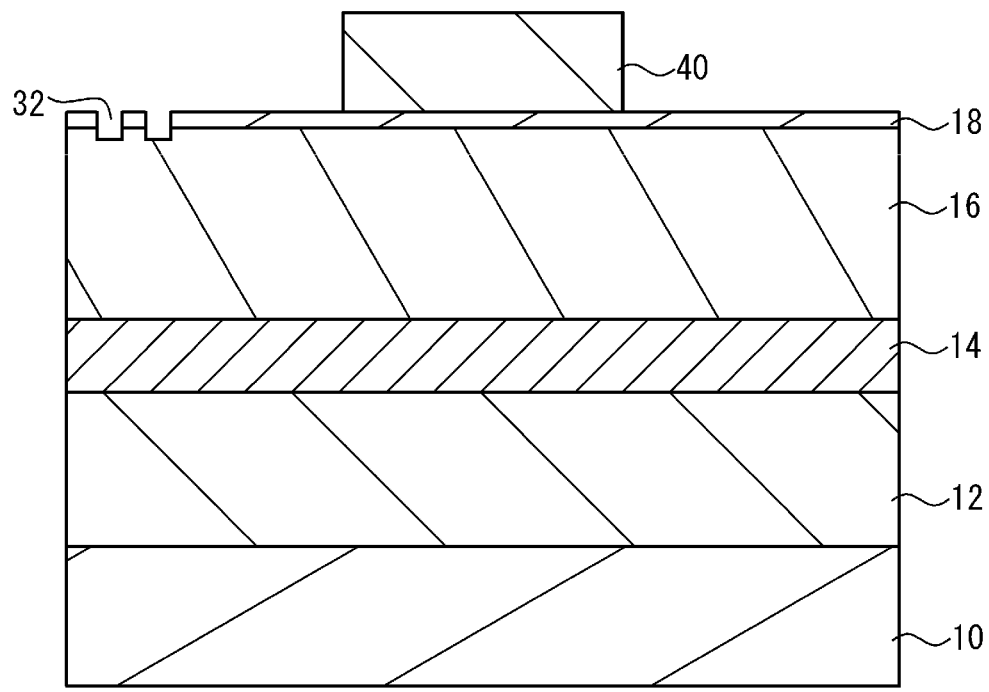
FIGS. 6A and 6B are plane views showing the example of the method of manufacturing the surface emitting laser.

Next, resist patterning is performed by exposure and development. First of all, as shown in FIG. 5A, a photoresist 40 having a thickness of 10 μm or more and 15 μm or less is spin-coated, for example. As shown in FIG. 5B, a part of the photoresist 40 is covered with a mask 42, and an ultraviolet (UV) light having a wavelength of, for example, 365 nm is irradiated using an exposure apparatus. As shown in FIG. 6A, an exposed portion of the photoresist 40 is dissolved with an alkaline solution such as tetramethyl ammonium hydroxide (TMAH), and a portion of the photoresist 40 covered with the mask 42 is left.

Figure 6B:
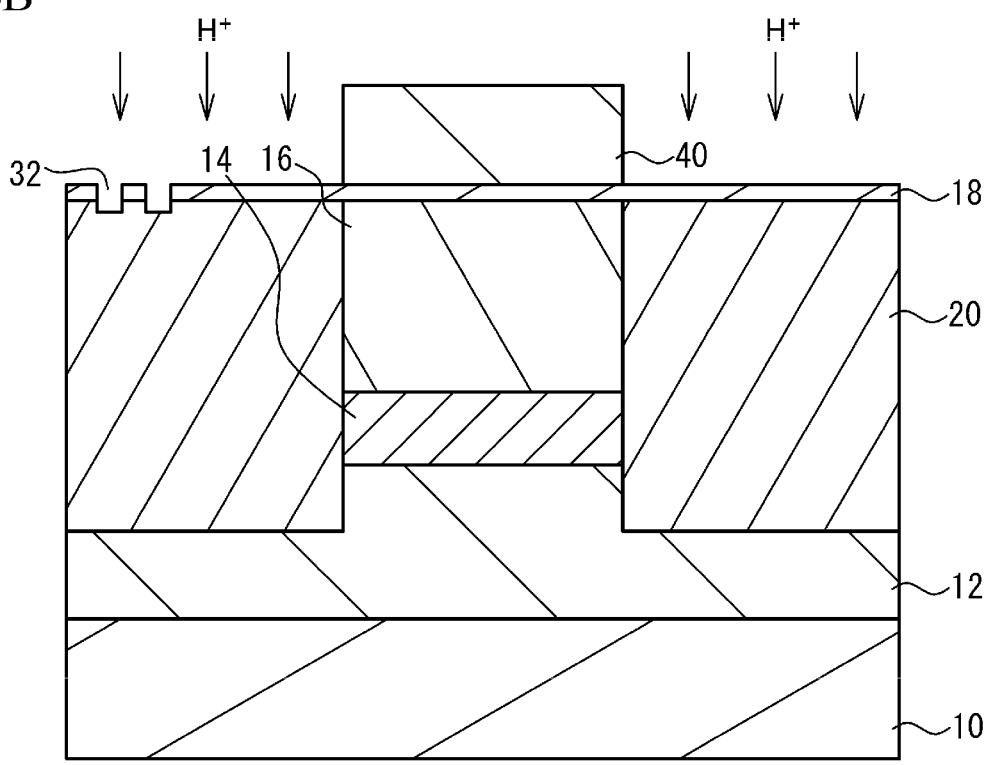

As shown in FIG. 6B, the high resistance region 20 is formed by implanting ions such as proton ($H^+$), for example. The proton is not implanted into the portion of the wafer covered with the photoresist 40, but implanted into the portion exposed from the photoresist 40. An implanting depth of the proton is, for example, 5 μm. The high resistance region 20 is formed on the periphery of the upper reflector layer 16, the active layer 14 and the part of the upper side of the lower reflector layer 12. After the ion implantation, the asking is performed with the organic solvent, the oxygen plasma and the like to remove the photoresist 40.

Figure 7A:
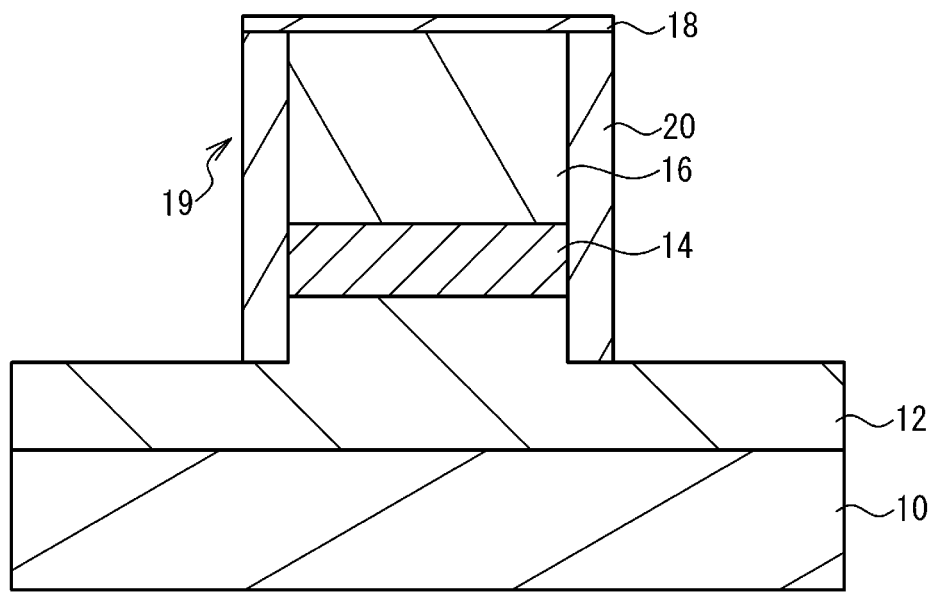
FIGS. 7A and 7B are plane views showing the example of the method of manufacturing the surface emitting laser.

As shown in FIG. 7A, dry etching is performed to remove a part of the high resistance region 20 and form the mesa 19. For the dry etching, for example, an inductively coupled plasma reactive ion etching (ICP-RIE) apparatus is used, and, for example, a $BCl_3$ gas or a mixed gas of $BCl_3$ and $Cl_2$ is used as an etching gas. An example of etching conditions is shown below.

Figure 7B:
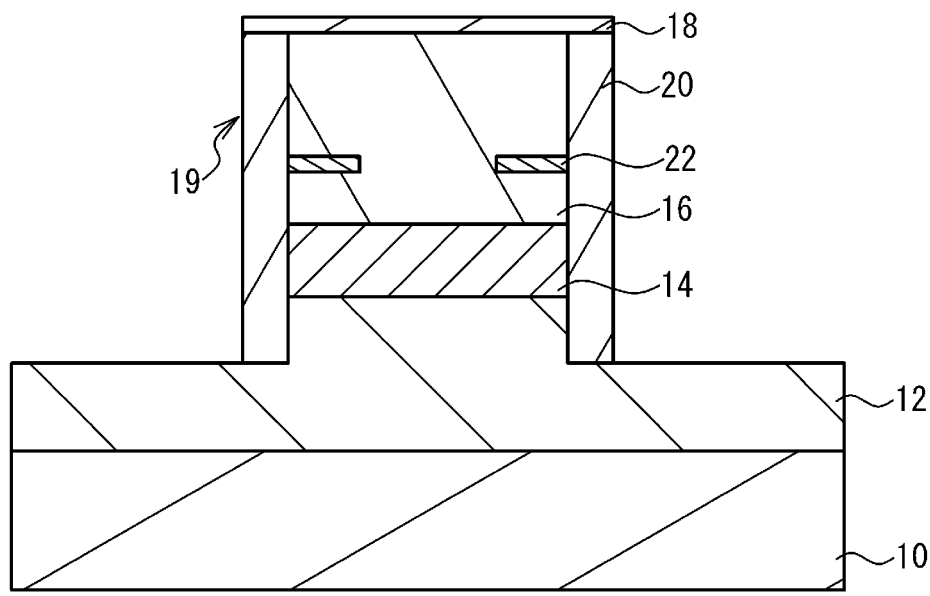
Figure 8A:
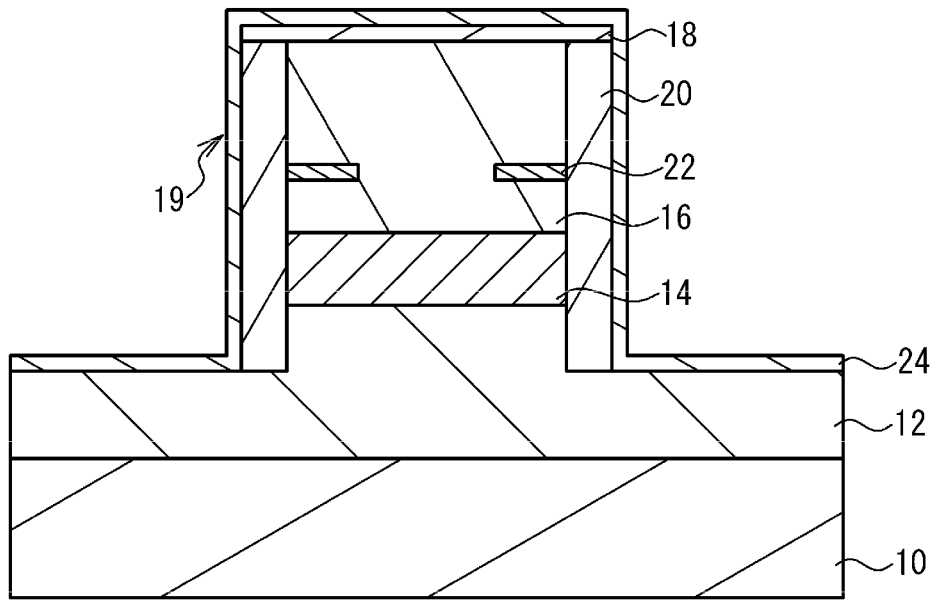
FIGS. 8A and 8B are plane views showing the example of the method of manufacturing the surface emitting laser.

$BCl_3$/Ar=30 sccm/70 sccm
(or $BCl_3$/$Cl_2$/Ar=20 sccm/10 sccm/70 sccm)
ICP power: 50 W to 1000 W
Bias power: 50 W to 500 W
Wafer temperature: 25° C. or less As shown in FIG. 7B, the wafer is heated to, for example, about 400° C. in a water vapor atmosphere, so that a part of the upper reflector layer 16 is oxidized from an end side to form the current constriction layer 22. As shown in FIG. 8A, the insulating film 24 is formed by, for example, the plasma CVD method or the like.

Figure 8B:
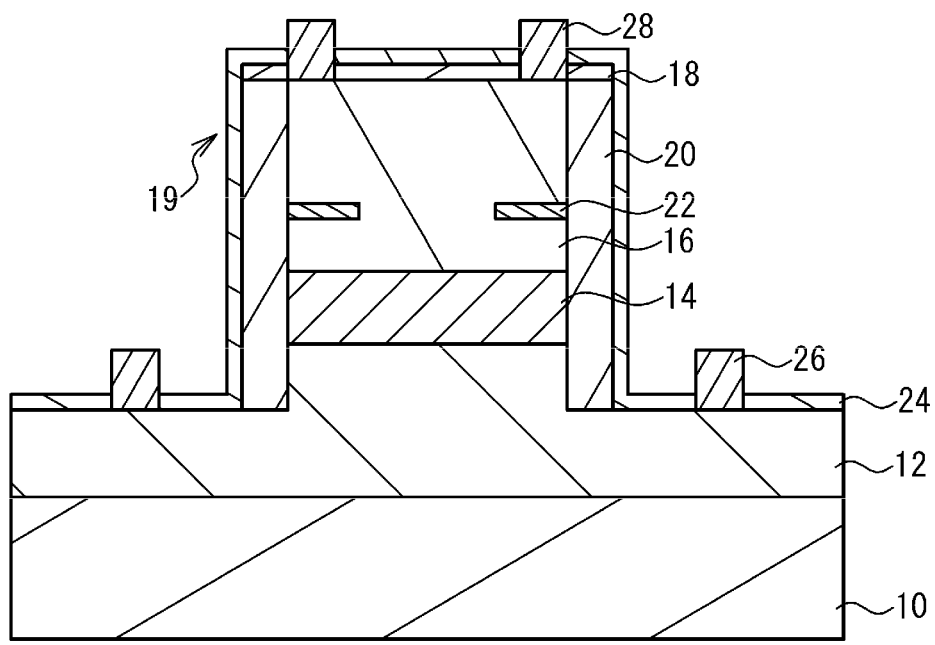

As shown in FIG. 8B, parts of the insulating films 18 and 24 are opened, and the electrode 26 is formed on the surface of the lower reflector layer 12 and the electrode 28 is formed on the surface of the upper reflector layer 16 by the resist patterning and a vacuum evaporation method. After forming the electrodes, for example, heat treatment is performed at a temperature of about 400° C. for 1 minute to make the ohmic contact. Wirings to be connected to the electrodes 26 and 28 may be formed by plating or the like.

A back surface of the substrate 10 is polished using a back grinder, a lapping device or the like to thin the wafer to a thickness of about 100 μm to 200 μm. The wafer is cut with a dicer to form the chip-like surface emitting laser 100.

Comparative Example

Figure 9:
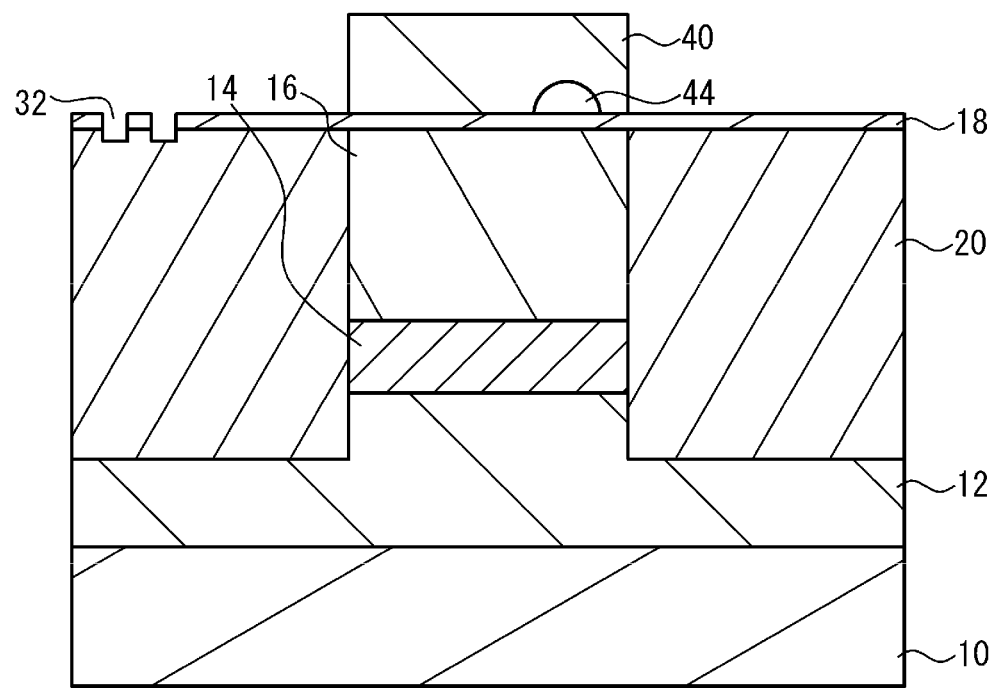
FIG. 9 is a plane view showing the example of the method of manufacturing the surface emitting laser according to a comparative example.

FIG. 9 is a plane view showing the example of the method of manufacturing the surface emitting laser according to a comparative example. In the comparative example, water is used in the cleaning before forming the photoresist 40. That is, steps corresponding to those of FIGS. 2A to 3A in the first embodiment are performed, and the immersion in the IPA is also performed. Thereafter, cleaning with the pure water is performed for the IPA replacement. Also, spin drying is performed instead of the drying in the IPA atmosphere.

After the immersion in the IPA, when the wafer is cleaned with the pure water, the moisture is aggregated in the oxide film 18a and the siloxane 34. When the HMDS process is performed in a state where the moisture is aggregated, the HMDS is hydrolyzed to generate $NH_3$, and $NH_3$ is dissolved in the aggregation water. After the HMDS process, the photoresist 40 is applied to the wafer. Since the photoresist 40 has a thickness of 10 μm or more, the aggregation water is unlikely to be released. When the wafer is irradiated with ultraviolet light during exposure, the ultraviolet light gasifies $NH_3$ in the aggregation water, and a bubble 44 is generated under the photoresist 40 as shown in FIG. 9. Therefore, the photoresist 40 is peeled off, and ions are implanted at unintended positions.

According to a first embodiment, after forming the insulating film 18, the cleaning is performed with the IPA and the drying is performed in the IPA vapor. That is, since the cleaning is performed with the IPA instead of water, the aggregation of the moisture on the surface is suppressed, and the generation of the bubble due to the moisture is also suppressed. Therefore, according to the first embodiment, the peeling of the photoresist 40 can be suppressed. When the processed wafer was observed with an optical microscope, twenty-one bubbles were generated on the wafer in the comparative example, whereas no bubbles were generated on the wafer in the first embodiment. Therefore, the possibility of the peeling of the photoresist 40 can be greatly reduced.

As shown in FIGS. 3B and 4A, the wafer is immersed in the IPA, the IPA replacement to the wafer is performed, and further the wafer is dried in the IPA vapor. Since the organic substances such as the siloxane 34 are removed by the IPA, the aggregation of the moisture is effectively suppressed. Moreover, since the replacement with the pure water and the drying in the water vapor atmosphere are not performed, the moisture is less likely to adhere to the wafer, and the generation of the bubbles is more effectively suppressed.

When the drying is performed in the IPA vapor as shown in FIG. 4A, the IPA vapor liquefies on the wafer surface. Therefore, the organic substances can be removed more effectively and the generation of the aggregation water can be suppressed. Moreover, the IPA molecules remain on the surface of the insulating film 18 after the drying, so that the surface becomes hydrophobic and the re-adhesion of the moisture is also suppressed. Therefore, the peeling of the photoresist 40 due to the formation of the bubbles is suppressed. In particular, the drying is preferably performed in an atmosphere of IPA 100% containing no water vapor. At the time of drying, the temperature is set to a boiling point (82.6° C.) or more of the IPA and an ignition point (399° C.) or less, and is preferably, for example, 200° C.

It is difficult to remove the moisture aggregated in the oxide film and the siloxane 34 by the heat treatment at 120° C. for about 1 minute, for example. In addition, the heat treatment for a long time reduces the efficiency of the process and causes high cost. According to the first embodiment, the generation of the aggregation water is suppressed by the IPA cleaning, so that the high cost can be avoided and the peeling of the photoresist 40 can be suppressed.

When the HMDS process is performed in a state where the moisture is aggregated as shown in the comparative example, $NH_3$ is generated, and dissolved in the aggregation water, and therefore the bubbles are easily generated during the exposure. According to first embodiment, since the IPA cleaning is performed before the HMDS process, the aggregation water is hard to be generated. Therefore, the generation and the dissolution of $NH_3$ and the generation of the bubbles are suppressed, and the peeling of the photoresist 40 is effectively suppressed.

As shown in FIG. 2B, the resist patterning and the etching of the insulating film 18 are performed to form the marks 32, and the photoresist 30 is removed by the oxygen ashing. As shown in FIG. 3A, the oxide film 18a is formed in the insulating film 18 by the oxygen ashing. The oxide film 18a easily aggregate the moisture compared with the insulating film 18 before oxidation. According to the first embodiment, since the cleaning is performed with the IPA, the aggregation of the moisture to the oxide film 18a can be suppressed, and the generation of the bubbles can be suppressed. Here, if the insulating film 18 is left in the air, it may be oxidized. According to the first embodiment, even when natural oxidation occurs, the aggregation of the moisture can be suppressed.

When the insulating film 18 is an SiN film, the oxide film 18a of $SiO_2$ is formed by the above-described oxygen ashing or the like. According to the first embodiment, since the cleaning is performed with the IPA, the aggregation of the moisture to the oxide film 18a can be suppressed. Here, the insulating film 18 may be made of an insulator other than SiN. Further, the substrate 10, the lower reflector layer 12, the active layer 14, and the upper reflector layer 16 may be made of compound semiconductors other than the above.

In the VCSEL, protons are implanted to a depth of, for example, 5 μm or more. The photoresist 40 has a thickness of, for example, 10 μm or more in order to shield high energy protons. Since the photoresist 40 is thick, the moisture under the photoresist 40 is hard to be released, which may cause the bubbles. According to the first embodiment, since the photoresist 40 is formed after the IPA cleaning, the moisture hardly remains under the photoresist 40. Therefore, the bubbles are hard to be generated, and the peeling of the photoresist 40 is suppressed.

What is claimed is:

1. A method of manufacturing a surface emitting laser comprising:
    preparing a substrate on which a lower reflector layer, an active layer and an upper reflector layer are formed in this order, each of the lower reflector layer and the upper reflector layer including a semiconductor multi-layer film;
    forming an insulating film on the upper reflector layer;
    cleaning the substrate using isopropyl alcohol after the forming of the insulating film;
    patterning a photoresist by applying the photoresist on the insulating film and exposing the photoresist, after the cleaning of the substrate; and
    forming a high resistance region by implanting ions into portions of the lower reflector layer, the active layer and the upper reflector layer exposed from the photoresist, after the patterning of the photoresist;
    wherein the cleaning includes cleaning the substrate with liquid isopropyl alcohol and drying the substrate in a vapor of the isopropyl alcohol.

2. The method of manufacturing the surface emitting laser according to claim 1, wherein
    the cleaning of the substrate with the liquid isopropyl alcohol includes immersing the substrate in the isopropyl alcohol, and replacing liquid isopropyl alcohol adhering to the substrate with another isopropyl alcohol.

3. The method of manufacturing the surface emitting laser according to claim 1, further comparing:
    processing a surface of the insulating film with hexamethyldisilazane (HMDS) after the cleaning of the substrate and before the patterning of the photoresist.

4. The method of manufacturing the surface emitting laser according to claim 1, wherein
    the forming of the insulating film includes forming a resist pattern on the insulating film, etching a part of the insulating film using the resist pattern, and removing the resist pattern by oxygen ashing.

5. The method of manufacturing the surface emitting laser according to claim 1, wherein
    the insulating film is a silicon nitride film.

6. The method of manufacturing the surface emitting laser according to claim 1, wherein
a depth to which the ions are implanted is 5 μm or more, and a thickness of the photoresist is 10 μm or more.

* * * * *